(12) United States Patent
Morikita et al.

(10) Patent No.: US 8,315,060 B2
(45) Date of Patent: Nov. 20, 2012

(54) ELECTRONIC COMPONENT MODULE AND METHOD OF MANUFACTURING THE ELECTRONIC COMPONENT MODULE

(75) Inventors: Yutaka Morikita, Ogaki (JP); Yuji Kataoka, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/888,452

(22) Filed: Sep. 23, 2010

(65) Prior Publication Data
US 2011/0013349 A1    Jan. 20, 2011

Related U.S. Application Data

(63) Continuation of application No. PCT/JP2009/053835, filed on Mar. 2, 2009.

(30) Foreign Application Priority Data

Mar. 31, 2008    (JP) ................. 2008-090534

(51) Int. Cl.
*H05K 1/00* (2006.01)
*H05K 1/18* (2006.01)
*H05K 7/00* (2006.01)

(52) U.S. Cl. ........ 361/748; 361/761; 361/762; 361/763; 361/764

(58) Field of Classification Search .......... 361/748, 361/704, 705, 761–764; 257/687
See application file for complete search history.

(56) References Cited

U.S. PATENT DOCUMENTS

| | | | |
|---|---|---|---|
| 6,201,696 B1 * | 3/2001 | Shimizu et al. | 361/704 |
| 6,603,154 B2 * | 8/2003 | Sakai et al. | 257/166 |
| 6,864,574 B1 | 3/2005 | Nobori et al. | |
| 7,765,686 B2 * | 8/2010 | Murakami et al. | 29/831 |
| 2008/0024091 A1 * | 1/2008 | Yamazaki et al. | 320/166 |

FOREIGN PATENT DOCUMENTS

| | | |
|---|---|---|
| JP | 2000-223647 A | 8/2000 |
| JP | 2001-223321 A | 8/2001 |
| JP | 2001-244688 A | 9/2001 |
| JP | 2003-258009 A | 9/2003 |
| JP | 2005-317935 A | 11/2005 |

OTHER PUBLICATIONS

Official Communication issued in International Patent Application No. PCT/JP2009/053835, mailed on Apr. 21, 2009.
Official Communication issued in corresponding Chinese Patent Application No. 200980110588.3, mailed on Sep. 2, 2011.

* cited by examiner

*Primary Examiner* — Yuriy Semenenko
*Assistant Examiner* — Andargie M Aychillhum
(74) *Attorney, Agent, or Firm* — Keating & Bennett, LLP

(57) ABSTRACT

An electronic component module includes a circuit substrate including surface mount components mounted thereon, a resin layer embedding the surface mount components, and a conductor layer provided on a surface of the resin layer, wherein a conductive post is provided on the surface mount component, and an external electrode having a ground potential provided on the surface mount component is conductively connected to the conductor layer through the conductive post, whereby the conductor layer defines a shielding layer.

7 Claims, 12 Drawing Sheets

ELECTRONIC COMPONENT MODULE AND METHOD OF MANUFACTURING THE ELECTRONIC COMPONENT MODULE

BACKGROUND OF THE INVENTION

1. Field of the Invention

The present invention relates to an electronic component module including a circuit substrate having a surface mount component mounted thereon, a resin layer covering the surface mount component, and a conductor layer that functions as a shielding layer and that is provided on the resin layer. The present invention also relates to a method of manufacturing the electronic component module.

2. Description of the Related Art

In accordance with increasing market requirements for reduction in size and multifunctionality, electronic components used for electronic apparatuses, such as mobile communication apparatuses, are often used in the form of a high-frequency module in which various surface mount components are mounted on a circuit substrate made of a ceramic, a synthetic resin, or other materials.

To prevent such a high-frequency module arranged in a casing, a motherboard, or other component from being electromagnetically influenced by various surrounding electronic devices, or to prevent the high-frequency module from electromagnetically influencing the various electronic devices, a configuration may be used in which the surface mount components mounted on the circuit substrate are covered with a shielding layer having a ground potential.

For example, Japanese Unexamined Patent Application Publication No. 2000-223647 discloses a high-frequency module in which a conductor film having a shielding effect is provided on the surface of a resin layer in which surface mount components are embedded, and the circuit substrate is directly connected to the conductor film through a pin-shaped conductive ground terminal provided on the circuit substrate. In addition, Japanese Unexamined Patent Application Publication No. 2005-317935 discloses a module component in which a conductor film having a shielding effect is similarly provided on the surface of a resin layer in which surface mount components are embedded, and the circuit substrate is directly connected to the conductor film through a block partitioning member provided on the circuit substrate.

However, in the modules disclosed in Japanese Unexamined Patent Application Publication No. 2000-223647 and Japanese Unexamined Patent Application Publication No. 2005-317935, since the pin-shaped ground terminal or block partitioning member must be provided on the circuit substrate, the circuit substrate must have a space in which to provide the pin-shaped ground terminal or block partitioning member, which prevents a reduction in the size of the circuit substrate, and thus, prevents a reduction in the size of the electronic component module.

In other words, in a resin-sealed electronic component module with a conductor film, which is configured to include a circuit substrate having surface mount components mounted thereon, a resin layer covering the surface mount components, and a conductor film provided on the surface of the resin layer, the structure through which the circuit substrate is directly connected to the conductor film through a conductive member, such as a pin-shaped ground terminal or a block partitioning member, requires a space in which to provide the conductive member, and hence limits a reduction in the size of the circuit substrate.

SUMMARY OF THE INVENTION

To overcome the problems described above, preferred embodiments of the present invention provide an electronic component module which enables efficient use of space on a circuit substrate and a reduction in the size of the circuit substrate, and a method of manufacturing the electronic component module.

A preferred embodiment of the present invention provides an electronic component module including a circuit substrate including at least one surface mount component mounted thereon, a resin layer covering the surface mount component, and a conductor layer provided on a surface of the resin layer, wherein at least one conductive post is provided on the surface mount component, and the surface mount component is conductively connected to the conductor layer through the conductive post.

Another preferred embodiment of the present invention provides a method of manufacturing an electronic component module, the method including the steps of preparing a circuit substrate including at least one surface mount component mounted thereon, forming a conductive post having a predetermined height on the circuit substrate, providing, on the circuit substrate, a resin layer that covers the surface mount component and through which a portion of the conductive post is exposed at a surface of the resin layer, and forming, on the surface of the resin layer, a conductor layer conductively connected to the conductive post exposed at the surface of the resin layer.

In the electronic component module according to a preferred embodiment of the present invention, since the conductor layer on the surface of the resin layer is electrically connected to the surface mount component by the conductive post provided on the surface mount component mounted on the circuit substrate, a space on the surface of the circuit substrate can be efficiently used, thereby reducing the size of the circuit substrate and the size of the electronic component module.

In the method of manufacturing the electronic component module according to a preferred embodiment of the present invention, the electronic component module is reliably manufactured, and since the resin layer is provided after the conductive post has been formed on the surface mount component mounted on the circuit substrate, holes for forming the conductive post need not be formed in advance in the resin layer covering the surface mount component, and thus, the electronic component module can be efficiently manufactured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
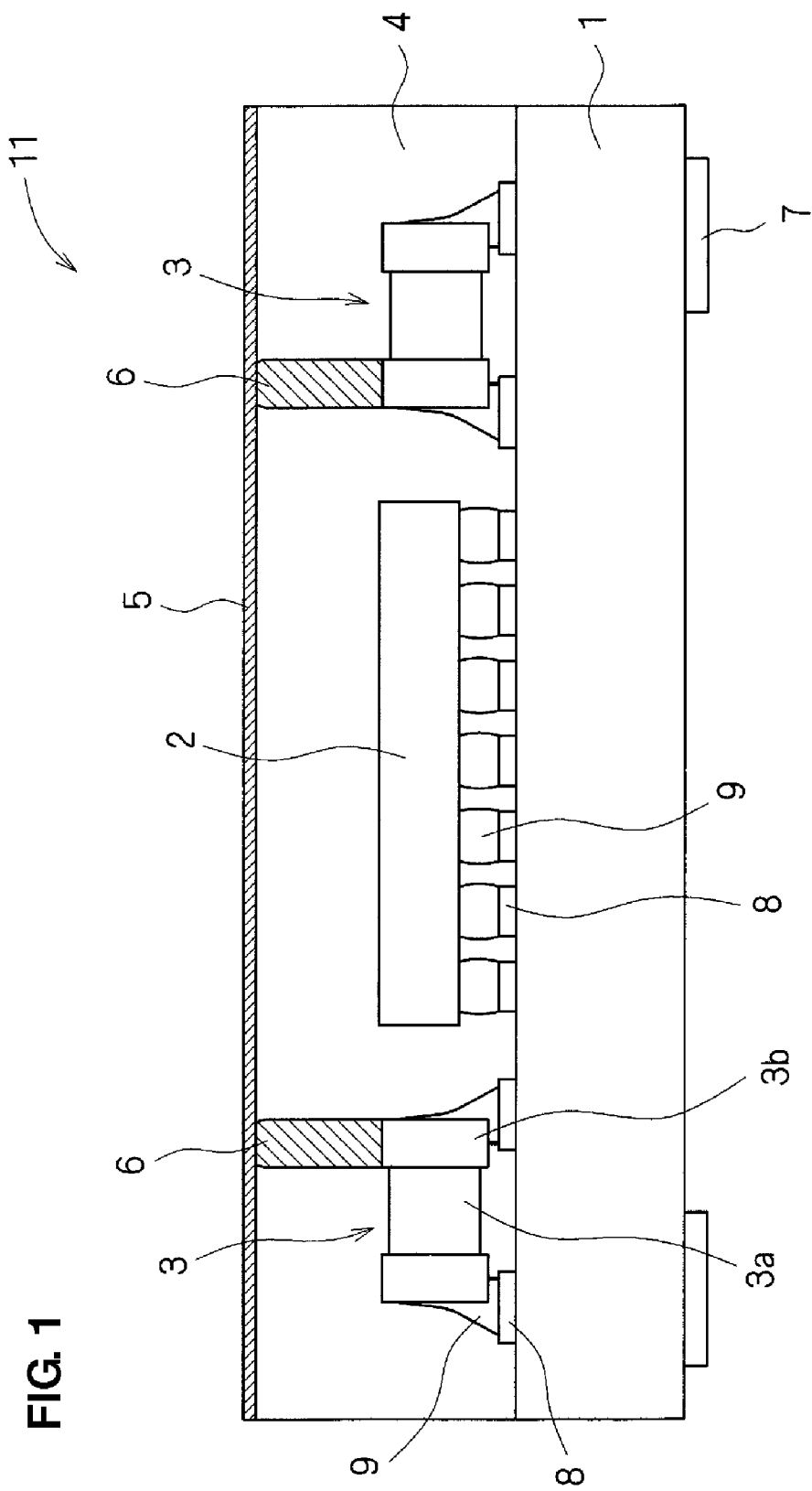
FIG. 1 is a sectional view illustrating an electronic component module according to a first preferred embodiment of the present invention.

First, an electronic component module according to a first preferred embodiment will be described with reference to FIG. 1. FIG. 1 is a sectional view illustrating an electronic component module 11 according to the first preferred embodiment of the present invention.

Referring to FIG. 1, the electronic component module according to the first preferred embodiment includes a circuit substrate 1 having surface mount components 2 and 3 mounted thereon, a resin layer 4 covering the surface mount components 2 and 3, and a conductor layer 5 provided on the resin layer 4. Conductive posts 6 and 6 are provided on the upper surfaces of the surface mount components 3, and the surface mount component 3 is conductively connected to the conductor layer 5 through the conductive post 6.

More specifically, in the electronic component module 11, a plurality of electrode pads 8 are provided on the upper surface of the circuit substrate 1, and the surface mount components 2 and 3 are connected to the respective electrode pads 8 through conductive cement, such as solder 9, for example. A plurality of electrode pads 7, which are electrodes for enabling connection to a mother board (not illustrated), for example, are provided on the lower surface of the circuit substrate 1. The surface mount components 2 and 3 are sealed with the resin layer 4, thereby allowing the surface mount components 2 and 3 to be fixed to the circuit substrate 1 and the surface mount components 2 and 3 to be protected from the external environment.

The surface mount component 3 connected to the conductive post 6 includes an external electrode 3b arranged continuously on an end surface and a portion of the side surfaces adjacent to the end surface of a rectangular parallelepiped component body 3a, similar to multi-layer chip capacitors, for example. The circuit substrate 1 side of the external electrode 3b of the surface mount component 3 is connected to the electrode pad 8 of the circuit substrate 1 and the opposite side is connected to the conductive post 6. In other words, in the first preferred embodiment, the conductive post 6 is provided on the external electrode 3b of the surface mount component 3, and the conductor layer 5 is electrically connected to the external electrode 3b of the surface mount component 3 through the conductive post 6.

Specifically in the first preferred embodiment, the external electrode 3b of the surface mount component 3 is at the ground potential, and the conductor layer 5 defines a shielding layer due to the external electrode 3b being electrically connected to the conductor layer 5 through the conductive post 6. Note that the conductor layer 5 defining a shielding layer is preferably provided over the entire or substantially the entire upper surface of the resin layer 4, but may be formed in a partial manner, for example, only above the surface mount component 3 that is likely to electromagnetically influence other electrical components or the surface mount component 3 likely to be electromagnetically influenced by other electrical components. In addition to the upper surface of the resin layer 4, the conductor layer 5 may be provided on all of the sides of the electronic component module 11 or on the sides of the resin layer 4.

Figure 2:
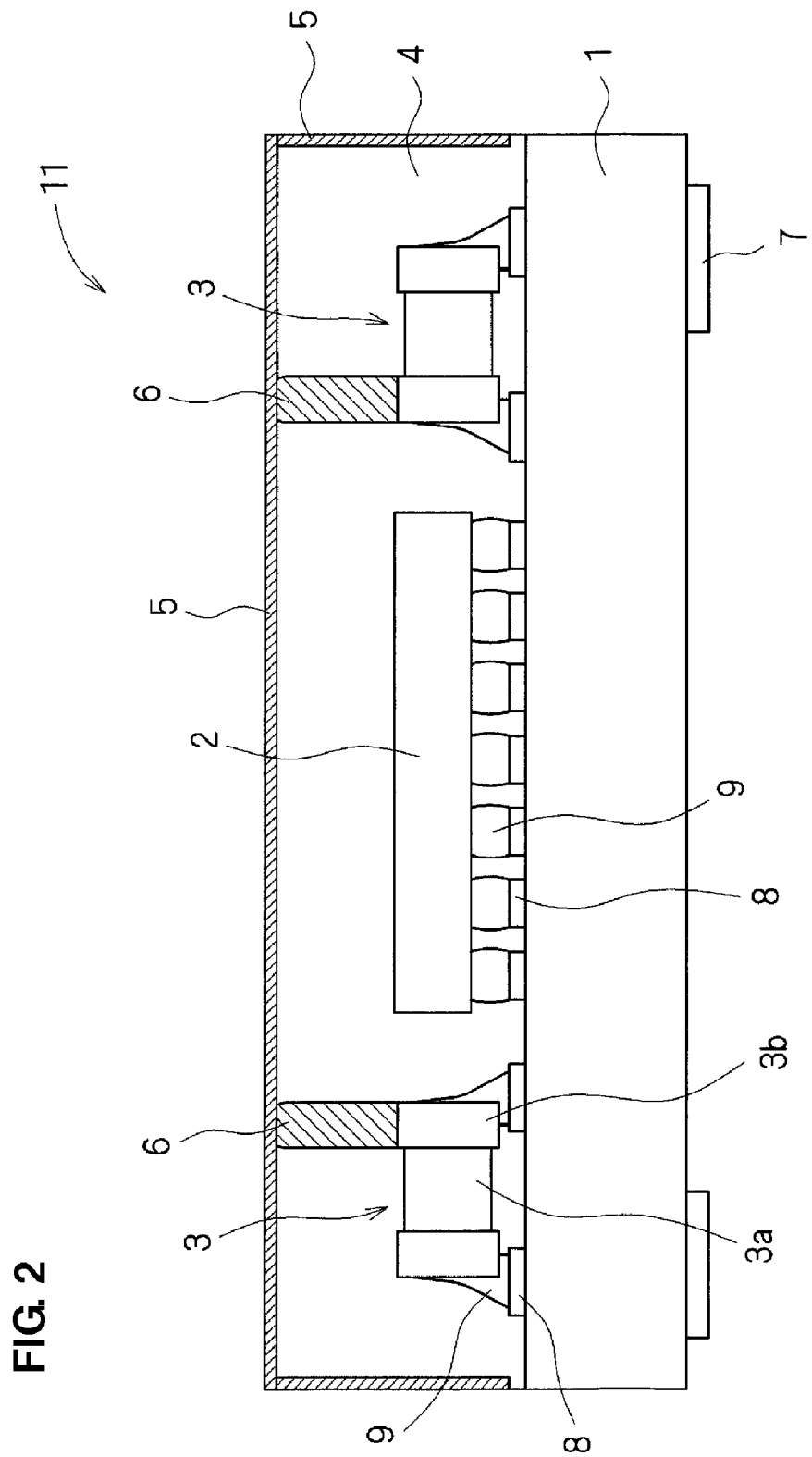
FIG. 2 is a sectional view illustrating the electronic component module according to the first preferred embodiment of the present invention in the case in which a conductor layer is also formed on the sides of the resin layer.

FIG. 2 is a sectional view illustrating the electronic component module 11 according to the first preferred embodiment of the present invention in the case in which the conductor layer 5 is also provided on the sides of the resin layer 4. Referring to FIG. 2, the conductor layer 5 is provided not only above the surface mount components 3 but also on the sides of the resin layer 4.

When the conductor layer 5 is also formed on the sides of the resin layer 4, a groove-shaped cut-in portion having a predetermined depth is preferably formed using a blade or other suitable tool at a border at which the electronic component module 11 is to be cut out. By applying a fluid conductive material to the cut-in portion such that the cut-in portion is fully filled with the fluid conductive material, the conductor layer 5 is formed on the sides of the cut-out electronic component module 11.

Regarding the depth of the cut-in portion to be formed, the cut-in portion may or may not extend to the circuit substrate 1. In the case in which the cut-in portion extends to the circuit substrate 1, the shielding layer functions more reliably. In the case in which the cut-in portion does not extend to the circuit substrate 1, since the cut-in portion is be formed only in the resin layer 4, the manufacturing process is simplified.

The surface mount component 2 is preferably an active chip component, such as a bare semiconductor chip or a semiconductor package, for example, and the surface mount component 3 is preferably a passive chip component, such as a chip capacitor, a chip inductor, or a chip resistor, for example. Examples of substrates used for the circuit substrate 1 include a ceramic substrate primarily made of a ceramic material and a resin substrate made of a synthetic resin. The circuit substrate preferably includes predetermined circuit patterns (not illustrated) including functional devices, such as a capacitor and an inductor, and wiring lines on the surface and/or the inside thereof, for example. It is preferable that a heat curable resin be used as the resin layer 4, and materials of the resin layer 4 may preferably include a filler component, such as a ceramic to control strength, a dielectric constant, thermal characteristics, and viscosity, for example.

A plurality of the conductive posts 6 may preferably be formed as in the first preferred embodiment. Note that the conductive post 6 is preferably formed on at least one of the surface mount components 2 and 3. In the case in which a plurality of the conductive posts 6 are provided in the electronic component module 11, the conductive post 6 directly connecting the circuit substrate 1 to the conductor layer 5 may be provided in addition to the conductive posts 6 connecting the surface mount components 2 and 3 to the conductor layer 5. Furthermore, in accordance with the requirement for increased the shielding capability, a plurality of the conductive posts 6 may be provided on one of the surface mount components 2 and 3.

It is preferable that the conductive post 6 be formed by piling up a fluid conductive material and then solidifying the material, and more preferably, be a sintered metal obtained by sintering a piled up fluid conductive material at a predetermined temperature. When the conductive post 6 is a sintered metal, since the conductive post 6 itself has high strength and is unlikely to change shape due to heat during the curing of the resin layer 4, possible damage to the conductive post 6 during the formation of the resin layer 4 is kept to a minimum.

It is preferable that the conductive post 6 have a tapered shape with the cross-sectional area gradually decreasing from the surface mount component 2 or 3 side toward the conductor layer 5 side. By configuring the conductive post 6 to have a tapered shape with the cross-sectional area decreasing toward the conductor layer 5, that is, thinner at the tip, the flat resin layer 4 can be formed uniformly on the circuit substrate 1 without damaging the conductive post 6 when the resin layer 4 is formed, specifically, when resin sheets are stacked on top of one another.

It is preferable that the conductive post 6 have a height, i.e., a length between the surface mount component 2 or 3 and the conductor layer 5, of about 30 μm to about 300 μm, for example to ensure the strength and reliability of the conductive post 6. It is preferable that, when the cross section is a circle, the conductive post 6 have a diameter of about 20 μm to about 100 μm, for example, so as to allow a reduction in the size of the surface mount component 2 or 3.

Figure 3:
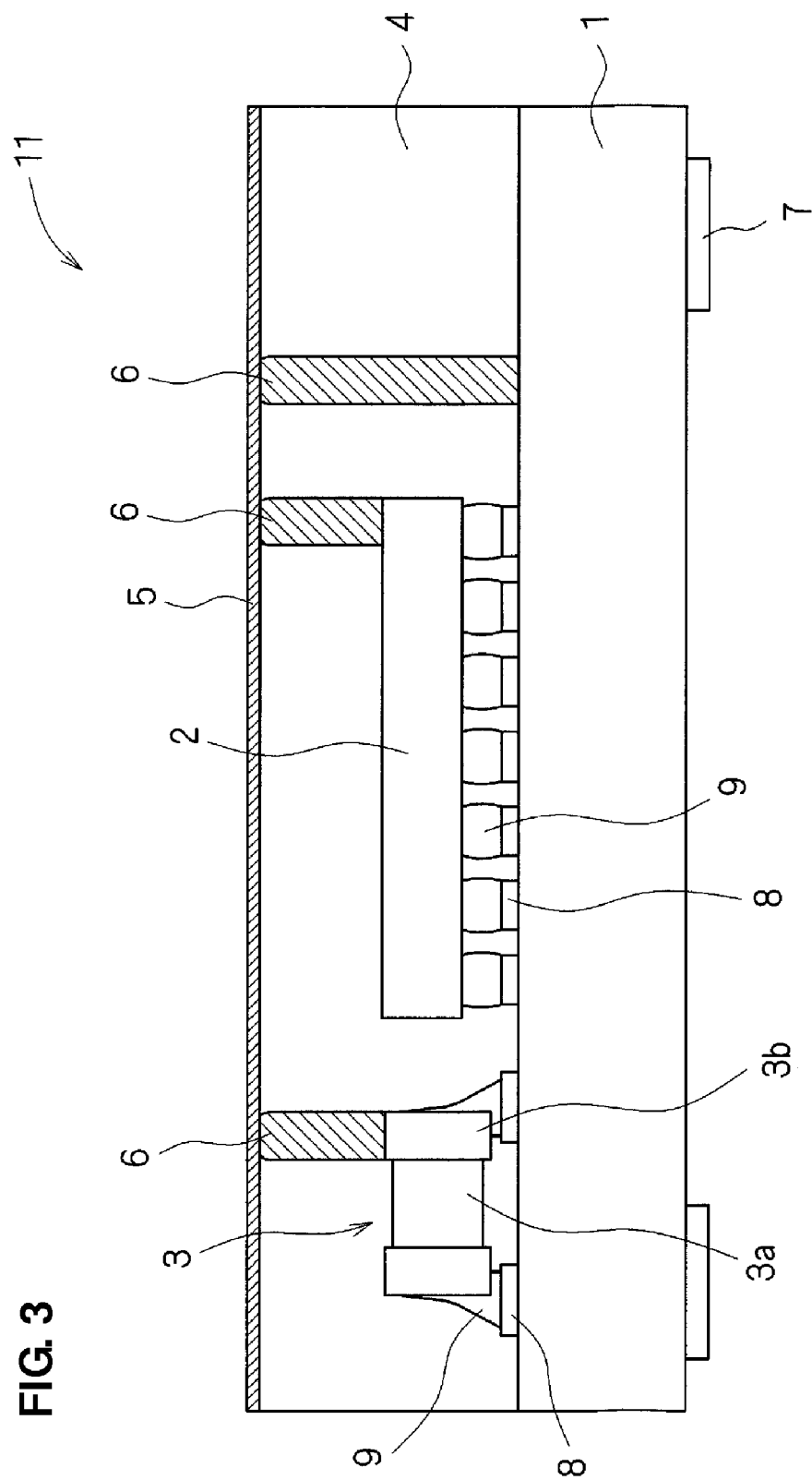
FIG. 3 is a sectional view illustrating the electronic component module according to the first preferred embodiment of the present invention, including a conductive post for directly connecting a circuit substrate to a conductor layer.

FIG. 3 is a sectional view illustrating the electronic component module 11 according to the first preferred embodiment of the present invention, where the configuration includes a conductive post 6 arranged to directly connect the circuit substrate 1 to the conductor layer 5. Referring to FIG. 3, the conductive post 6 may directly and conductively connect the circuit substrate 1 to the conductor layer 5, in addition to connecting the upper portions of the surface mount components 2 and 3 to the conductor layer 5.

The conductive post 6 having a predetermined height is formed by piling up a fluid conductive material on the external electrode 3b of the surface mount component 3 or the circuit substrate 1 and then solidifying the material. An example of a fluid conductive material to be used is a conductive solution prepared by dispersing conductive powder in a solvent. The conductive solution is ejected several times from the discharging opening of a nozzle using an inkjet method, a jet dispenser method, or other suitable method, whereby the conductive powder is piled up, accumulated, and solidified. Thereby, the conductive post 6 having any of various heights can be easily formed.

Note that when the conductive post 6 is formed using an inkjet method, a jet dispenser method, or other suitable method, by volatilizing the solvent included in the conductive solution at every incremental increase in height, the conductive post 6 can be stabilized stepwise starting from the bottom. Thus, even when the height of the conductive post 6 is increased, the strength and reliability can be ensured.

As described above, since the conductor layer 5 on the surface of the resin layer 4 is electrically connected to the surface mount component 3 by the conductive post 6 formed in the resin layer 4 on the surface mount component 3, the space of the surface of the circuit substrate 1 can be efficiently used, thus providing the electronic component module 11 having a reduced size and an increased packaging density.

Figure 4:
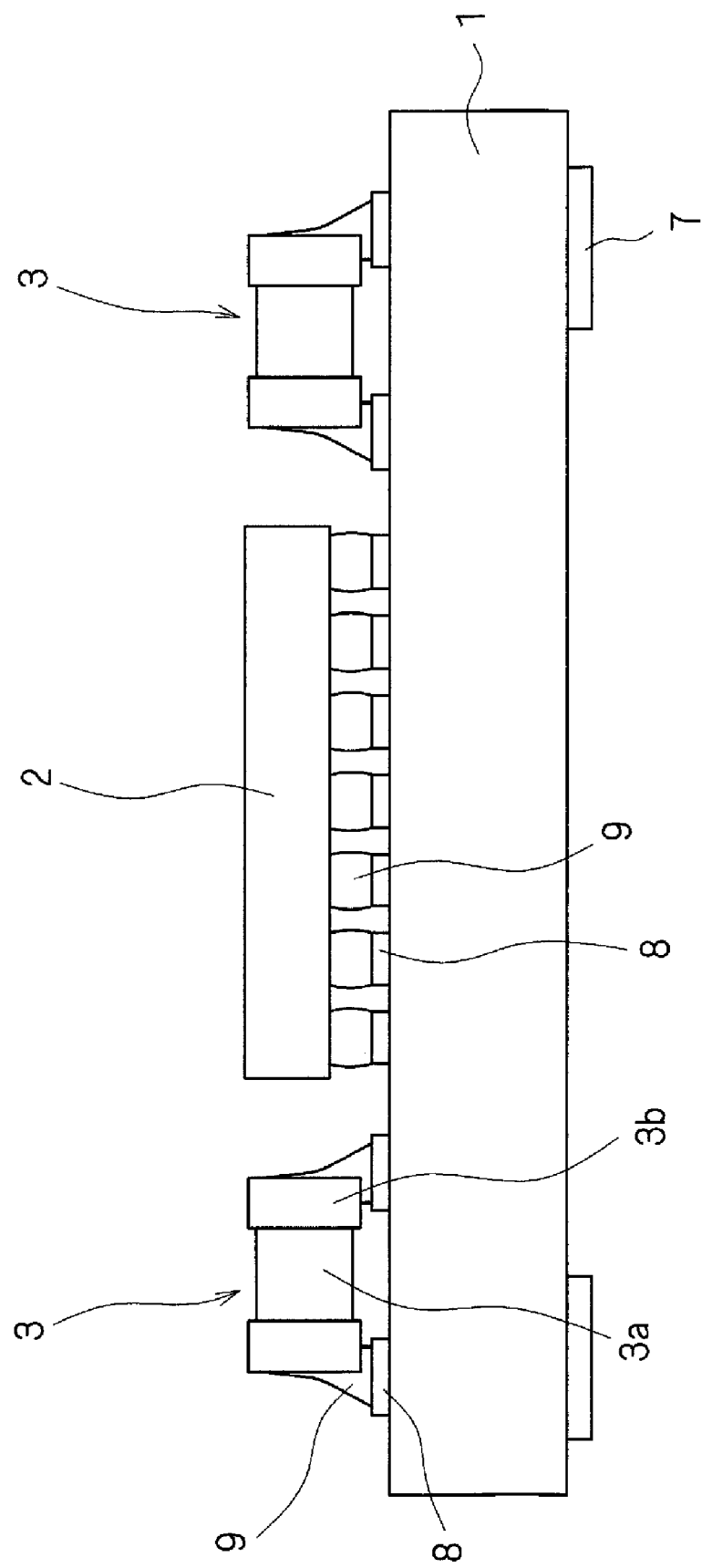
FIG. 4 is a sectional view of the electronic component module according to the first preferred embodiment of the present invention in a state in which surface mount components have been mounted.

Hereinafter, a method of manufacturing the electronic component module 11 of the first preferred embodiment is described with reference to FIGS. 4 to 8. FIG. 4 is a sectional view of the electronic component module 11 according to the first preferred embodiment of the present invention in a state in which the surface mount components 2 and 3 have been mounted.

First, referring to FIG. 4, the circuit substrate 1 for mounting the surface mount components 2 and 3 is prepared. Note that in the example in FIGS. 4 to 8, a ceramic multilayer substrate is used as the circuit substrate 1.

Ceramic slurry is first prepared by mixing a ceramic material with an organic binder, an organic solvent, and other suitable components in respectively predetermined amounts. Then, the ceramic slurry is applied to a carrier film, such as PET, for example, using the doctor blade method, for example, and ceramic green sheets are produced by cutting the ceramic slurry together with the carrier film. Then, after forming interlayer connection holes in the ceramic green sheet using, for example, a laser, the formed interlayer connection holes are filled with a conductive paste, which is made by mixing a low-melting-point metal with an organic binder, a solvent, and other suitable components, thereby forming interlayer connection conductors.

Similarly, the conductive paste made by mixing a low-melting-point metal with an organic binder, a solvent, and other suitable components is printed using screen printing, for example, whereby in-plane wiring conductors are formed on the ceramic green sheet so as to form a predetermined circuit pattern. In this manner, a ceramic laminate to be sintered is produced by stacking a predetermined number of the green sheets on top of one another each having interlayer connection conductors and in-plane wiring conductors having a predetermined circuit pattern, and other suitable elements formed thereon. Then, the ceramic laminate is sintered at a predetermined temperature, thereby producing a ceramic multilayer substrate that is the circuit substrate 1 having electrode pads on the upper and lower surfaces thereof. Thereafter, plated films are formed on the electrode pads on the surfaces, as required.

Then the solder 9 is supplied to the electrode pads on the upper surface of the ceramic multilayer substrate using, for example, screen printing. After the surface mount components 2 and 3 have been mounted, the solder 9 is melted and solidified in a reflow furnace, whereby the surface mount components 2 and are fixed onto the upper surface of the ceramic multilayer substrate 1. Then, through a cleaning process, such as removing solder flux, for example, the circuit substrate 1 having the various surface mount components 2 and 3 mounted thereon is obtained.

Note that examples of low-temperature-sintering ceramic materials include: ceramic powders such as alumina, forsterite, and cordierite; a glass composite material made by mixing a ceramic powder with glass such as borosilicate; a crystallized glass material using crystallized glass such as ZnO—MgO—Al$_2$O$_3$—SiO$_2$; non-glass materials such as BaO—Al$_2$O$_3$—SiO$_2$ ceramic powder and Al$_2$O$_3$—CaO—SiO$_2$—MgO—B$_2$O$_3$ ceramic powder. By using a low-temperature-sintering material, low-resistance and low-melting-point materials, such as Ag and Cu, for example, can be used as the interlayer connection conductors, in-plane wiring conductors, and other suitable conductors. As a result, a conductor pattern primarily made of Ag, Cu, or other suitable material, for example, and a ceramic laminate to be sintered can be sintered at the same time at a relatively low temperature, for example, equal to or below about 1050° C.

Figure 5:
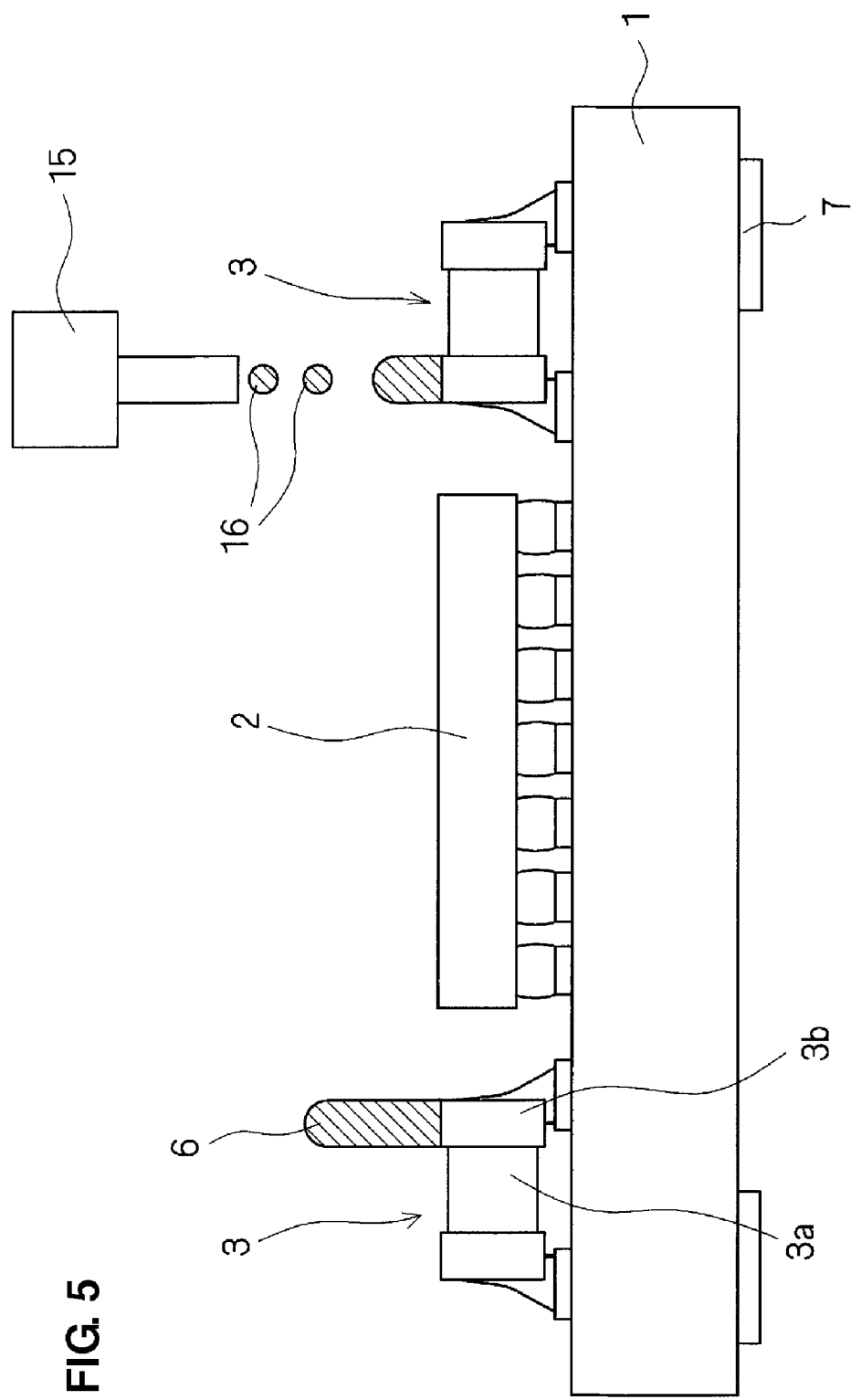
FIG. 5 is a sectional view of the electronic component module according to the first preferred embodiment of the present invention in a state in which conductive posts are being formed.

FIG. 5 is a sectional view of the electronic component module 11 according to the first preferred embodiment of the present invention illustrating a state in which the conductive posts 6 are being formed. Referring to FIG. 5, the conductive post 6 having a predetermined height is formed on the surface mount component 3 mounted on the upper surface of the circuit substrate 1. More specifically, the conductive post 6 having a predetermined height is formed by continuously piling up a fluid conductive material 16 on the external electrode 3b of the surface mount component 3 and then solidifying the fluid conductive material 16. For example, using a conductive solution made by dispersing conductive powder in a solvent as the fluid conductive material 16, the conductive solution is ejected several times from the discharging opening of a nozzle 15 using an inkjet method, a jet dispenser method, or other suitable method, for example, whereby the conductive powder is piled up, accumulated, and solidified. Thereby, the conductive post 6 having a predetermined height can be formed. Note that in addition to using the inkjet method, jet dispenser method, or other suitable, the conductive post 6 may also be formed by applying the fluid conductive material 16 having, for example, fluidity of conductive paste several times to specified locations using a method, such as screen printing, for example, and then solidifying the paste.

Figure 6:
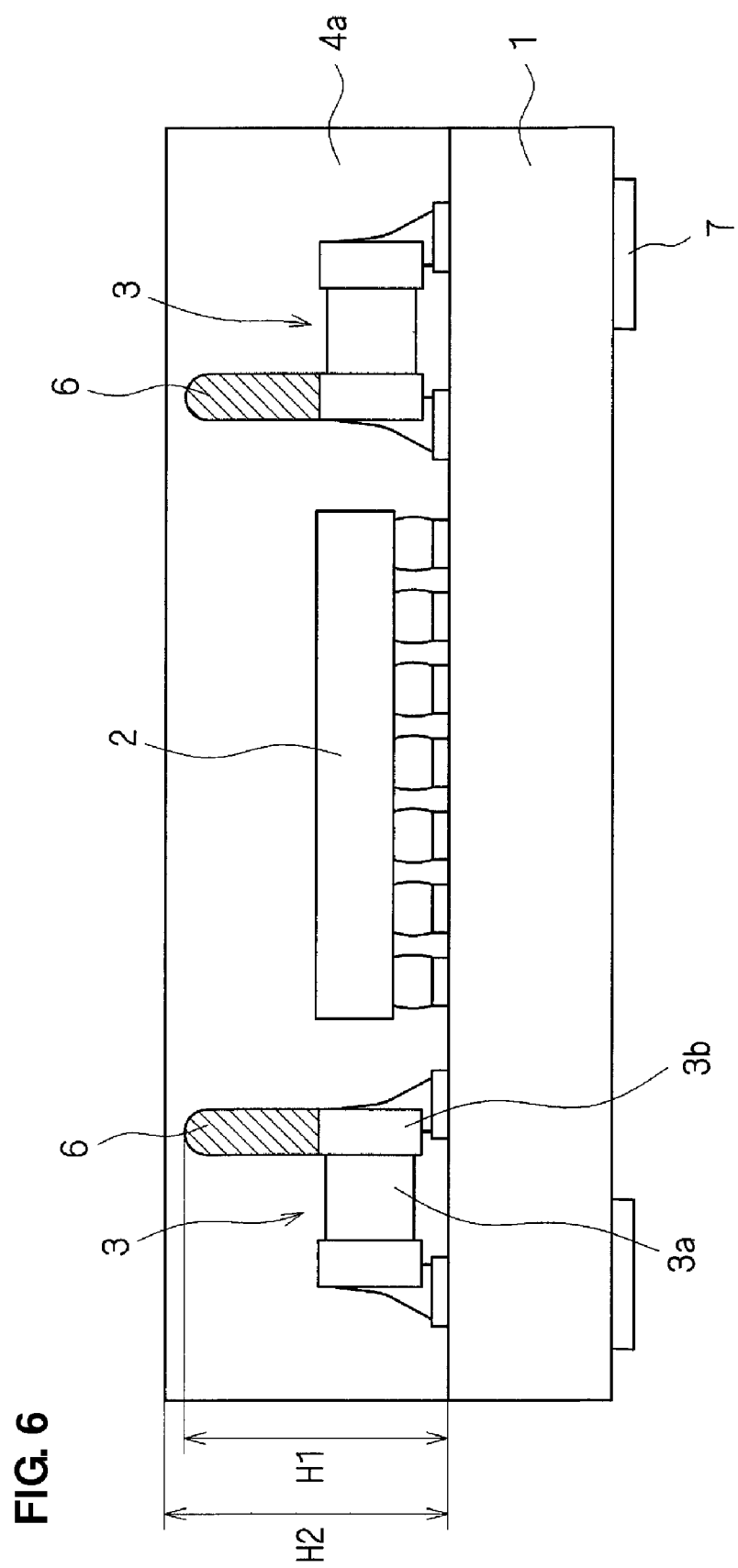
FIG. 6 is a sectional view of the electronic component module according to the first preferred embodiment of the present invention in a state in which a resin layer has been formed.

FIG. 6 is a sectional view of the electronic component module 11 according to the first preferred embodiment of the present invention in a state in which a resin layer 4a has been formed. Referring to FIG. 6, the resin layer 4a in a yet-to-be-cured state is provided on the circuit substrate 1 so as to cover the conductive posts 6 and the surface mount components 2 and 3. In more detail, the resin layer 4a in a yet-to-be-cured state is formed on the circuit substrate 1 having the conductive posts 6 with predetermined heights formed thereon using a resin sheet laminate in a softened state, a liquid resin transfer mold, coating of a liquid resin, or other suitable method, for example. Here, it is preferable to form the resin layer 4a in a state in which the fluidity has been enhanced by applying heat at a predetermined temperature and thereby lowering the viscosity of and enhancing the fluidity of the liquid resin. Note that, in FIG. 6, it is preferable to make a thickness H2 of the resin layer 4a greater than a height H1 (that is, a height obtained by adding the height of the surface mount component 3 to the height of the conductive post 6).

Figure 7:
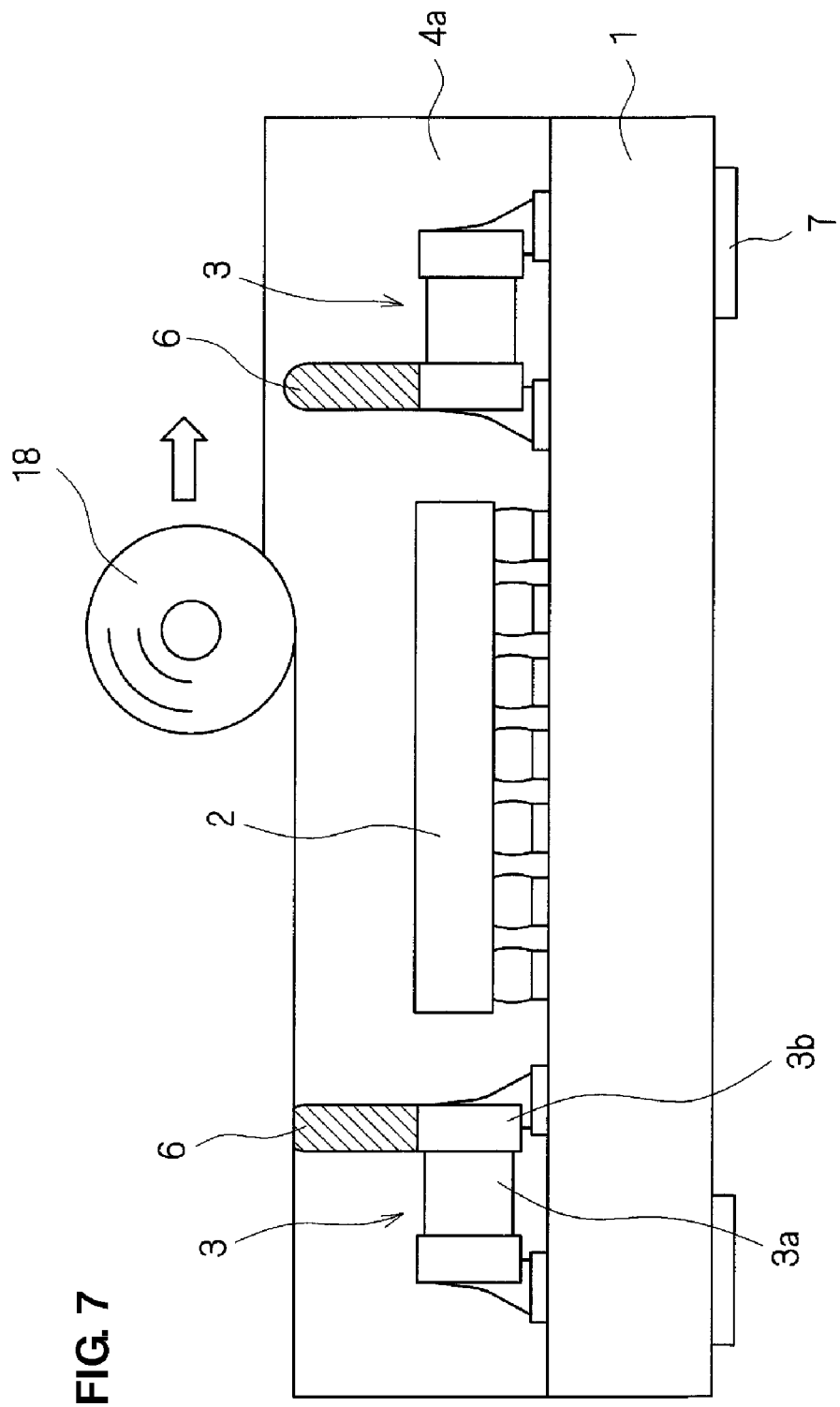
FIG. 7 is a sectional view of the electronic component module according to the first preferred embodiment of the present invention in a state in which the resin layer is being ground to a predetermined depth.

FIG. 7 is a sectional view of the electronic component module 11 according to the first preferred embodiment of the present invention in a state in which the resin layer 4a is being ground to a predetermined depth. Referring to FIG. 7, the surface of the resin layer 4a is flattened and a portion of the conductive post 6 is reliably exposed at the surface of the resin layer 4a by grinding the resin layer 4a to a predetermined depth through movement of a grinding roll 18 in the direction of the arrow, for example.

As described above, it is preferable that the conductive post 6 be a sintered metal obtained by sintering a conductive material at a predetermined temperature. When the conductive post 6 is a sintered metal, the conductive post 6 has high strength, and is unlikely to change shape due to heat during the curing of the resin layer 4a, as described later. Thus, possible damage to the conductive post 6 is kept to a minimum. It is preferable that the conductive post 6 have a tapered shape with the cross-sectional area gradually decreasing from the surface mount component 3 side toward the conductor layer 5 side. When the conductive post 6 has a tapered shape with the cross-sectional area decreasing toward the conductor layer 5, that is, thinner at the tip, the flat resin layer 4 can be formed uniformly on the circuit substrate 1 without damaging the conductive post 6 when the resin layer 4a is to be formed, specifically, when a resin sheet is to be stacked on top of one another.

Figure 8:
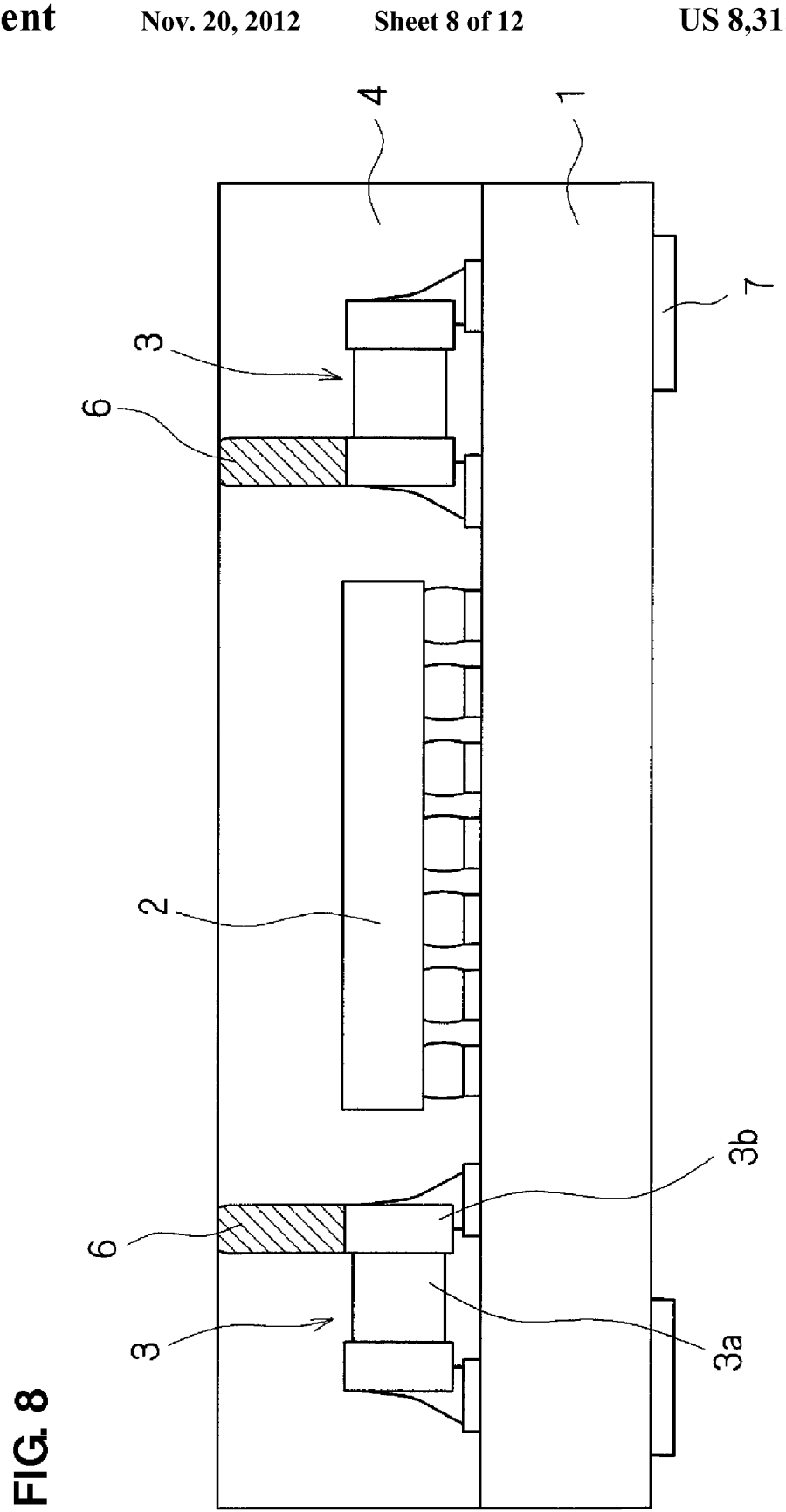
FIG. 8 is a sectional view of the electronic component module according to the first preferred embodiment of the present invention in a state in which portions of the conductive posts are exposed at the surface of the cured resin layer.

Then, the resin layer 4a in a yet-to-be-cured state is cured. FIG. 8 is a sectional view of the electronic component module 11 according to the first preferred embodiment of the present invention in a state in which portions of the conductive posts 6 are exposed at the surface of the cured resin layer 4. Referring to FIG. 8, portions of the conductive posts 6 are exposed at the surface of the cured resin layer 4, and the conductive posts 6 are supported and fixed by the resin layer 4. Then the conductor layer 5 electrically connected to the exposed portions of the conductive posts 6 can be formed (see FIG. 1) by applying a fluid conductive material to the surface of the resin layer 4 using a method such as screen printing, spray application, dispenser application, or spin coating, for example, and then hardening the fluid conductive material. Note that the conductor layer 5 may be formed by hardening a fluid conductive material, or instead may be formed by bonding a metal foil, for example.

According to the method of manufacturing the electronic component module 11 described above, since the electronic component module 11 is covered with the resin layer 4 after the conductive posts 6 have been formed on the surface mount components 2 and 3 mounted on the circuit substrate 1, holes for forming the conductive posts 6 need not be formed after the resin layer 4 has been formed, and thus, possible damage to the surface mount components 2 and 3 due to, for example, laser processing is prevented and a reliable electronic component module can be efficiently manufactured. Further, when the holes for forming the conductive posts 6 are formed after the resin layer 4 has been formed, resins used for such a purpose are generally black, which causes difficulty in adjusting the positions of the holes. However, such a problem can also be avoided by forming the resin layer 4 after the conductive posts 6 have been formed on the surface mount components 2 and 3.

Although the manufacturing steps for the electronic component module 11 have been described for a single electronic component module 11, similar steps can be applied to a collective substrate (mother substrate) in which a plurality of circuit substrates (child substrates) are arranged in a grid.

In this case, a collective substrate of ceramic multilayer substrates is manufactured using steps similar to those described above. Then, after breaking grooves have been formed on the division lines of the collective substrate, the surface mount components 2 and 3 are mounted using steps similar to those described above, and the conductive posts 6 are formed. After the resin layer 4 has been formed such that portions of the conductive posts 6 are exposed using steps similar to those described above, breaking grooves are also formed in the resin layer 4 along the division lines. By applying a fluid conductive material to the surface of the resin layer 4 and hardening the conductive material, the conductor layer 5 connected to the exposed portions of the conductive posts 6 can be formed. In other words, by controlling the depths of the breaking grooves formed in the resin layer 4, the width of the conductor layer 5 formed on the sides of the resin layer 4 can be controlled. Note that if the conductor layer 5 is formed before the breaking grooves are formed, the conductor layer 5 can be formed only on the upper surface of the resin layer 4.

As described above, also in the case of a collective substrate, which includes a plurality of the circuit substrates 1, it is possible for the electronic component module 11 to be manufactured to have a decreased size and an increased packaging density without adding a special process step except for the conductive posts 6 being formed on the surface mount components 2 and 3.

Hereinafter, other preferred embodiments of the present invention are described.

Second Preferred Embodiment

Figure 9:
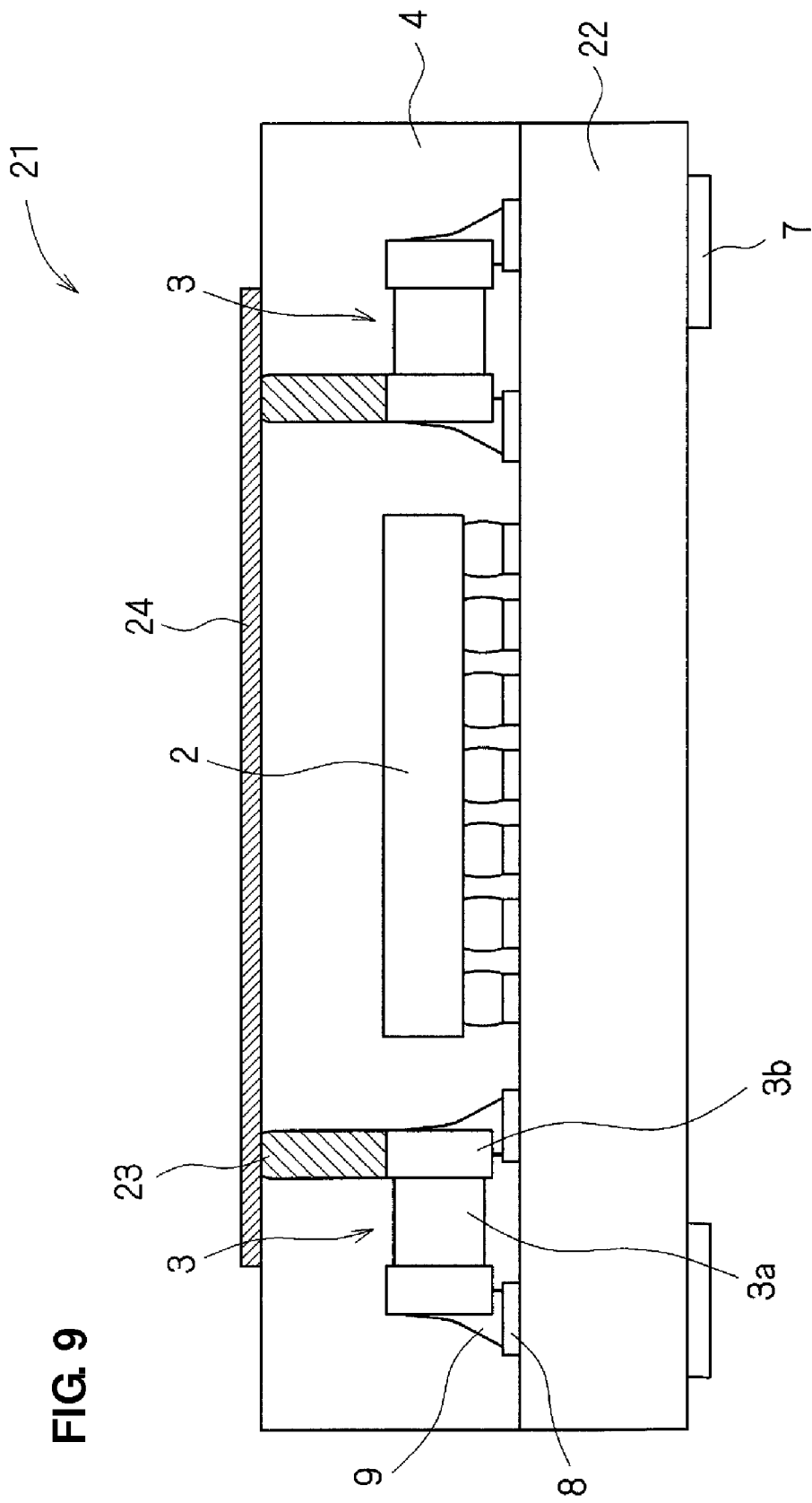
FIG. 9 is a sectional view illustrating an electronic component module according to a second preferred embodiment of the present invention.

FIG. 9 is a sectional view illustrating an electronic component module 21 according to a second preferred embodiment of the present invention. The electronic component module 21 illustrated in FIG. 9 includes a circuit substrate 22 including the surface mount components 2 and 3 mounted thereon, the resin layer 4 covering the surface mount components 2 and 3, and a conductor layer 24 which is provided on the surface of the resin layer 4 and defines an antenna. Conductive posts 23 are provided on the surface mount components 3, and the surface mount components 3 are connected to the conductor layer 24 through the conductive posts 23.

More specifically, similar to the first preferred embodiment, the circuit substrate 22 side of the external electrode 3b of the surface mount component 3 is connected to the electrode pad 8 of the circuit substrate 22, and the opposite side is connected to the conductive post 23. In other words, the conductive post 23 is formed on the external electrode 3b, and the conductor layer 24 is electrically connected to the external electrode 3b of the surface mount component 3 through the conductive post 6.

The external electrode 3b of the surface mount component 3 is a feeding electrode connected to the conductor layer 24, and the conductor layer 24 functions as an antenna as a result of the external electrode 3b being electrically connected to the conductor layer 24 through the conductive post 23.

Third Preferred Embodiment

Figure 10:
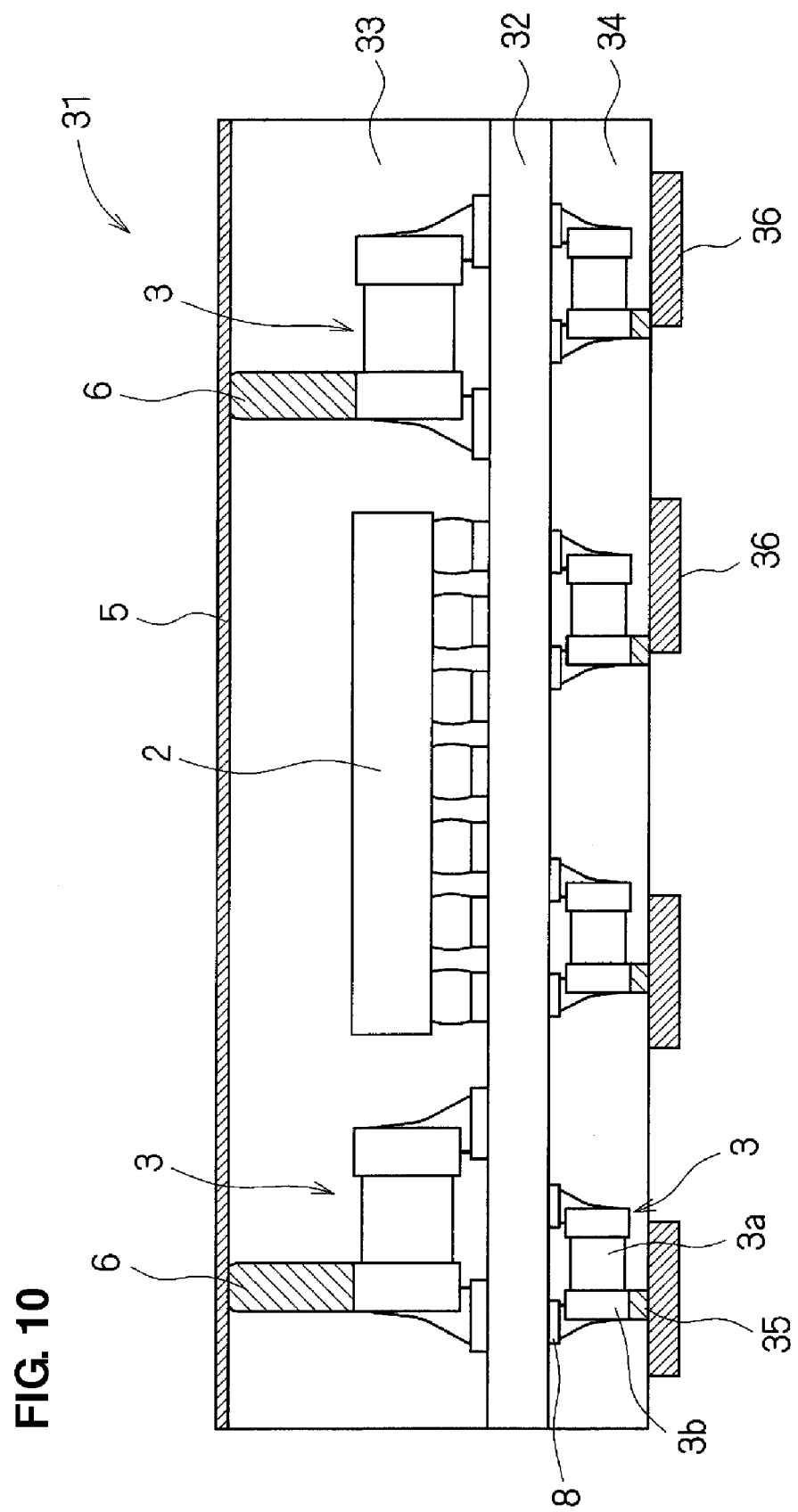
FIG. 10 is a sectional view illustrating an electronic component module according to a third preferred embodiment of the present invention.

FIG. 10 is a sectional view illustrating an electronic component module 31 according to a third preferred embodiment of the present invention. The electronic component module 31 illustrated in FIG. 10 includes a core substrate defined by a double-sided circuit substrate 32 in which the surface mount components 2 and 3 are mounted on the upper surface of the circuit substrate 32 and the surface mount components 3 are mounted on the lower surface of the circuit substrate 32. A resin layer 33 covering the surface mount components 2 and 3 is provided on the upper surface of the circuit substrate 32, and a resin layer 34 covering the surface mount components 3 is provided on the lower surface of the circuit substrate 32. The conductive posts 6, similar to those in the first preferred embodiment, are provided on the surface mount components 3 mounted on the upper surface of the circuit substrate 32, and the surface mount components 3 are connected to the conductor layer 5 through the conductive posts 6. The circuit substrate 32 side of the external electrode 3b of the surface mount component 3 mounted on the lower surface of the circuit substrate 32 is, similar to the preferred embodiments, connected to the electrode pad 8 of the circuit substrate 32, and the opposite side is connected to a conductive post 35. In other words, the conductive post 35 is provided on the external electrode 3b of the surface mount component 3, and a conductor layer 36 is electrically connected to the external electrode 3b of the surface mount component 3 through the conductive post 35.

The external electrode 3b of the surface mount component 3 mounted on the lower surface of the circuit substrate 32 is an input output terminal connected to a mother board (not illustrated), and functions as a connection electrode to be connected to the mother board, as a result of the external electrode 3b being electrically connected to the conductor layer through the conductive post 35. The conductor layers 36 functioning as connection electrodes are arranged as LGA pads on the surface of the resin layer 34.

Fourth Preferred Embodiment

Figure 11:
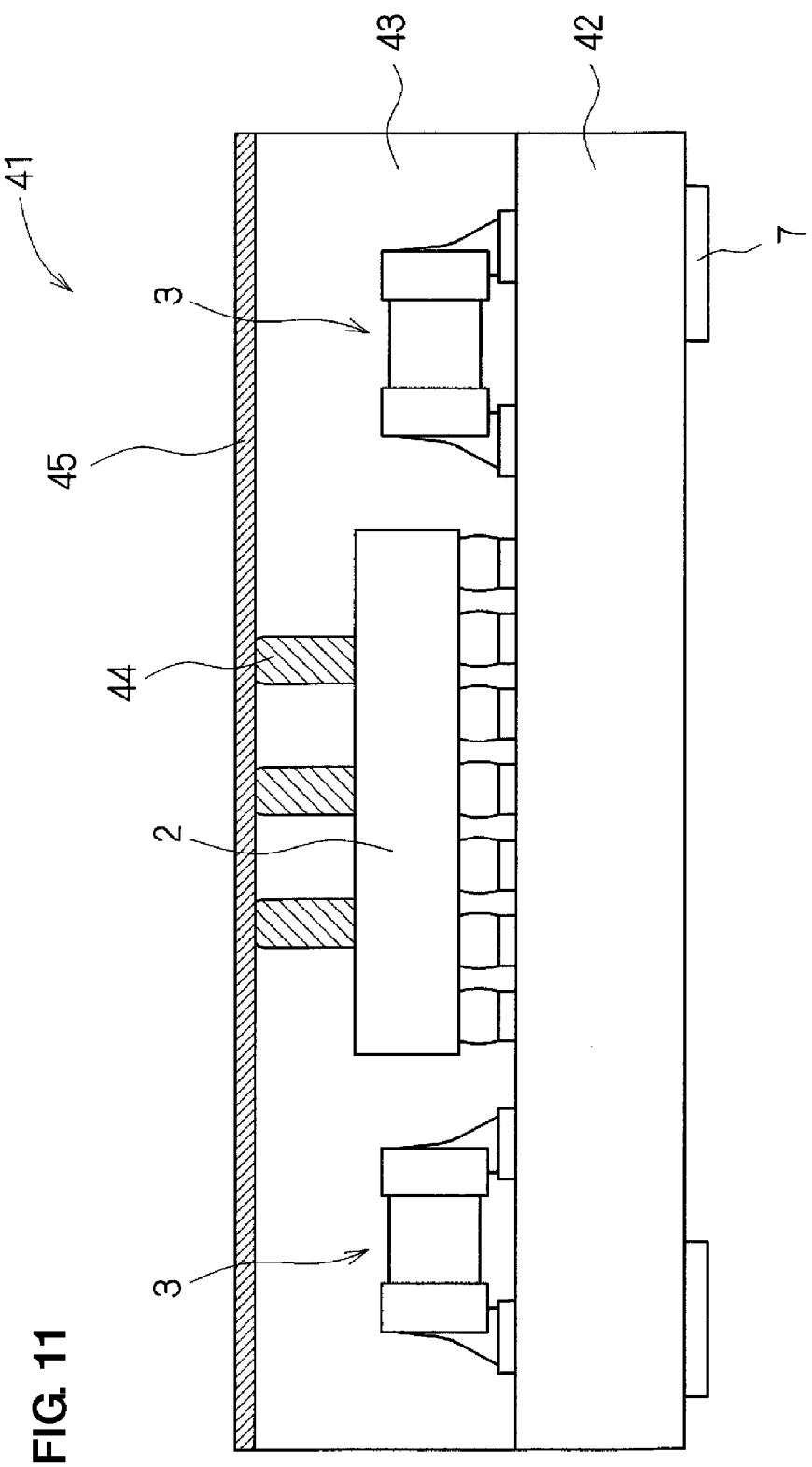
FIG. 11 is a sectional view illustrating an electronic component module according to a fourth preferred embodiment of the present invention.

FIG. 11 is a sectional view illustrating an electronic component module 41 according to a fourth preferred embodiment of the present invention. The electronic component module 41 illustrated in FIG. 11 includes a circuit substrate 42 including the surface mount components 2 and 3 mounted thereon, a resin layer 43 covering the surface mount components 2 and 3, and a conductor layer 45 provided on the surface of the resin layer 43. Conductive posts 44 are provided on the surface mount component 2, and the body of the surface mount component 2 is connected to the conductor layer 45 through the conductive posts 44.

Here, the surface mount component 2 is preferably an active component, such as a bare semiconductor chip or a semiconductor package, for example, or a heat generating surface mount component, such as a power amplifier, for example. The conductor layer 45 functions as a heat radiating electrode as a result of the surface mount component 2 being electrically connected to the conductor layer 45 through the conductive posts 44.

Note that in the case in which the surface mount component 2 includes a surface electrode having the ground potential on the side opposite the surface connected to the circuit substrate 42, the surface electrode may be electrically connected to the conductor layer 45 through the conductive post 44, thereby enabling the conductor layer 45 to also function as a shielding layer.

Fifth Preferred Embodiment

Figure 12:
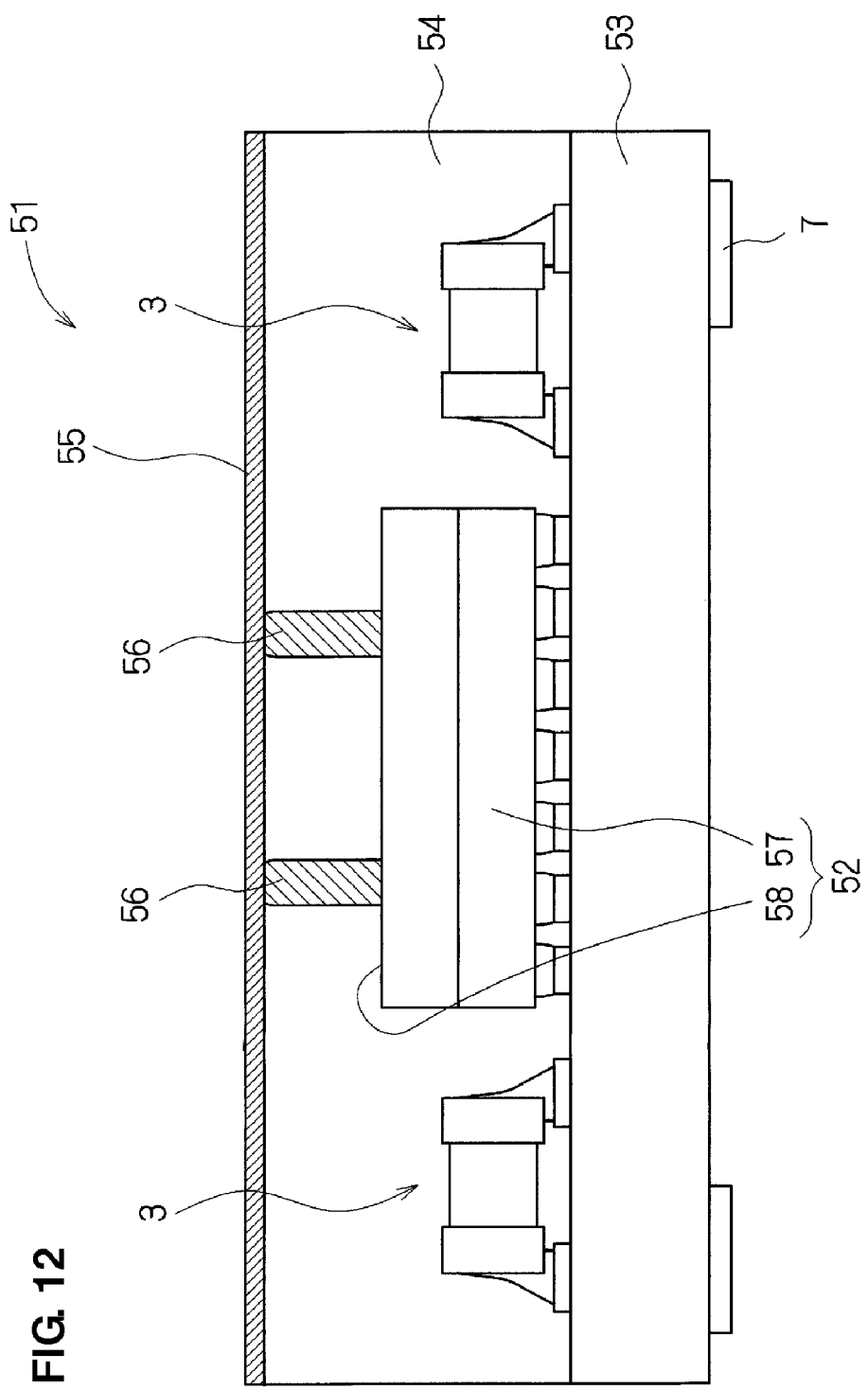
FIG. 12 is a sectional view illustrating of an electronic component module according to a fifth preferred embodiment of the present invention.

FIG. 12 is a sectional view illustrating an electronic component module 51 according to a fifth preferred embodiment of the present invention. The electronic component module 51 illustrated in FIG. 12 includes a circuit substrate 53 including the surface mount components 3 and 3 and a surface mount component 52 thereon, a resin layer 54 covering the surface mount components 3, 3, and 52, and a conductor layer 55 provided on the upper surface of the resin layer 54. Conductive posts 56 are provided on the surface mount components 52, and the surface mount component 52 is electrically connected to the conductor layer 55 through the conductive posts 56.

More specifically, the surface mount component 52 has a configuration in which various surface mount components (not illustrated) are mounted on a substrate 57, and the surface mount components on the substrate 57 are covered with a metal case 58 having a ground potential. The metal case 58 of the surface mount component 52 is electrically connected to the conductor layer 55 through the conductive posts 56. Thus, the conductor layer 55 also has a ground potential and functions as a shielding layer.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic component module comprising:
   a circuit substrate;

at least one surface mount component mounted on the circuit substrate;

a resin layer arranged to cover the at least one surface mount component; and a conductor layer provided on a surface of the resin layer; wherein at least one conductive post is provided on the at least one surface mount component;

the at least one surface mount component is conductively connected to the conductor layer through the at least one conductive post;

the at least one conductive post extends between the at least one surface component and the conductor layer and does not extend through the conductor layer; and the at least one conductive post has a tapered shape in which a cross-sectional area of the at least one conductive post gradually decreases from a surface-mount-component side towards a conductor-layer side.

2. The electronic component module according to claim 1, wherein the at least one conductive post is defined by a fluid conductive material that is piled up to a predetermined height and then solidified.

3. The electronic component module according to claim 1, wherein
the at least one surface mount component includes an external electrode provided on a surface thereof opposite a circuit substrate side; and
the at least one conductive post is arranged so as to be conductively connected to the external electrode.

4. The electronic component module according to claim 3, wherein the external electrode has a ground potential and is conductively connected to the conductor layer through the at least one conductive post.

5. The electronic component module according to claim 3, wherein
the external electrode is a feeding electrode connected to an antenna; and
the external electrode is conductively connected to the conductor layer through the at least one conductive post.

6. The electronic component module according to claim 3, wherein
the external electrode is an input/output terminal connected to a mother board; and
the external electrode is conductively connected to the conductor layer through the at least one conductive post.

7. The electronic component module according to claim 1, wherein
the surface mount component is a heat generating surface mount component; and
the surface mount component is conductively connected to the conductor layer through the at least one conductive post.

* * * * *